(12) United States Patent
Kim

(10) Patent No.: US 8,115,224 B2
(45) Date of Patent: Feb. 14, 2012

(54) LIGHT EMITTING DEVICE

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 110 days.

(21) Appl. No.: 12/573,523

(22) Filed: Oct. 5, 2009

(65) Prior Publication Data

US 2010/0181586 A1 Jul. 22, 2010

(30) Foreign Application Priority Data

Jan. 21, 2009 (KR) .................. 10-2009-0004951

(51) Int. Cl.
*H01L 33/00* (2010.01)

(52) U.S. Cl. ............ 257/98; 257/99; 257/E33.064; 257/E33.067; 257/79; 438/29; 438/39; 438/42; 438/46; 438/47

(58) Field of Classification Search .......... 257/98
See application file for complete search history.

(56) References Cited

U.S. PATENT DOCUMENTS

| | | | | |
|---|---|---|---|---|
| 5,528,057 A * | 6/1996 | Yanagase et al. | ........... | 257/96 |
| 6,015,979 A * | 1/2000 | Sugiura et al. | ........... | 257/86 |
| 6,111,277 A * | 8/2000 | Ikeda | ........... | 257/99 |
| 6,222,207 B1 * | 4/2001 | Carter-Coman et al. | ....... | 257/98 |
| 6,239,449 B1 * | 5/2001 | Fafard et al. | ........... | 257/17 |
| 6,316,785 B1 * | 11/2001 | Nunoue et al. | ........... | 257/14 |
| 6,462,358 B1 * | 10/2002 | Lin et al. | ........... | 257/99 |
| 6,469,320 B2 * | 10/2002 | Tanabe et al. | ........... | 257/79 |
| 6,475,882 B1 * | 11/2002 | Sakai et al. | ........... | 438/483 |
| 6,498,048 B2 * | 12/2002 | Morita | ........... | 438/22 |
| 6,583,443 B1 * | 6/2003 | Chang et al. | ........... | 257/79 |
| 6,649,437 B1 * | 11/2003 | Yang et al. | ........... | 438/30 |
| 6,667,196 B2 * | 12/2003 | Yu et al. | ........... | 438/142 |
| 6,673,667 B2 * | 1/2004 | Gorrell et al. | ........... | 438/240 |
| 6,744,071 B2 * | 6/2004 | Sano et al. | ........... | 257/79 |
| 6,762,069 B2 * | 7/2004 | Huang et al. | ........... | 438/22 |
| 6,781,160 B1 * | 8/2004 | Tsai et al. | ........... | 257/98 |
| 6,784,462 B2 * | 8/2004 | Schubert | ........... | 257/98 |
| 6,797,987 B2 * | 9/2004 | Chen | ........... | 257/98 |
| 6,900,068 B2 * | 5/2005 | Lin et al. | ........... | 438/29 |
| 7,005,667 B2 * | 2/2006 | Chen et al. | ........... | 257/14 |
| 7,011,983 B2 * | 3/2006 | Foust et al. | ........... | 438/99 |
| 7,071,494 B2 * | 7/2006 | Steigerwald et al. | ........... | 257/98 |
| 7,148,075 B2 * | 12/2006 | Peng et al. | ........... | 438/22 |
| 7,282,746 B2 * | 10/2007 | Lee et al. | ........... | 257/94 |
| 7,521,329 B2 * | 4/2009 | Kwak et al. | ........... | 438/328 |
| 7,566,576 B2 * | 7/2009 | Murofushi et al. | ........... | 438/29 |
| 7,675,077 B2 * | 3/2010 | Shei et al. | ........... | 257/97 |
| 7,723,216 B2 * | 5/2010 | Chakraborty et al. | ........... | 438/483 |
| 7,777,240 B2 * | 8/2010 | Lin et al. | ........... | 257/94 |

(Continued)

FOREIGN PATENT DOCUMENTS

JP 2005-277372 A 10/2005

(Continued)

*Primary Examiner* — N Drew Richards
*Assistant Examiner* — Ankush Singal
(74) *Attorney, Agent, or Firm* — Birch, Stewart, Kolasch & Birch, LLP

(57) ABSTRACT

A light emitting device That includes a first photonic crystal structure having a reflective layer and non-metal pattern elements on the reflective layer, a second conductive semiconductor layer on both the reflective layer and the non-metal pattern elements, an active layer on the second conductive semiconductor layer, and a first conductive semiconductor layer on the active layer.

14 Claims, 8 Drawing Sheets

U.S. PATENT DOCUMENTS

| | | | |
|---|---|---|---|
| 7,811,838 B2 * | 10/2010 | Hon | 438/22 |
| 7,812,361 B2 * | 10/2010 | Xu et al. | 257/98 |
| 7,834,373 B2 * | 11/2010 | Feng et al. | 257/99 |
| 7,838,317 B2 * | 11/2010 | Yoon et al. | 438/47 |
| 7,846,751 B2 * | 12/2010 | Wang | 438/22 |
| 2003/0164503 A1 * | 9/2003 | Chen | 257/79 |
| 2004/0135158 A1 * | 7/2004 | Hon | 257/85 |
| 2004/0206971 A1 * | 10/2004 | Erchak et al. | 257/98 |
| 2004/0235210 A1 * | 11/2004 | Tamura et al. | 438/22 |
| 2005/0063437 A1 * | 3/2005 | Horng et al. | 372/44 |
| 2005/0087884 A1 | 4/2005 | Stokes et al. | |
| 2005/0175274 A1 * | 8/2005 | Gunn, III | 385/16 |
| 2005/0184300 A1 | 8/2005 | Tazima et al. | |
| 2005/0205886 A1 * | 9/2005 | Murofushi et al. | 257/98 |
| 2006/0118802 A1 * | 6/2006 | Lee et al. | 257/98 |
| 2006/0145177 A1 * | 7/2006 | Hagimoto et al. | 257/99 |
| 2006/0151794 A1 * | 7/2006 | Wierer et al. | 257/79 |
| 2006/0234408 A1 * | 10/2006 | Lee et al. | 438/22 |
| 2006/0261353 A1 * | 11/2006 | Bandoh | 257/79 |
| 2007/0012937 A1 * | 1/2007 | Liu et al. | 257/99 |
| 2007/0096646 A1 * | 5/2007 | Van Nice et al. | 313/509 |
| 2007/0109639 A1 * | 5/2007 | Trevor et al. | 359/494 |
| 2007/0194324 A1 * | 8/2007 | Kim et al. | 257/79 |
| 2007/0194325 A1 | 8/2007 | Sung et al. | |
| 2007/0201527 A1 * | 8/2007 | Hori et al. | 372/50.124 |
| 2008/0142824 A1 | 6/2008 | Chen et al. | |
| 2008/0169479 A1 * | 7/2008 | Xu et al. | 257/94 |
| 2008/0179606 A1 | 7/2008 | Usuda et al. | |
| 2008/0283821 A1 * | 11/2008 | Park et al. | 257/13 |
| 2009/0026478 A1 | 1/2009 | Yoon et al. | |
| 2009/0074024 A1 * | 3/2009 | Noda et al. | 372/50.12 |
| 2010/0052010 A1 * | 3/2010 | Yoon | 257/103 |
| 2010/0140643 A1 * | 6/2010 | Cho et al. | 257/98 |
| 2010/0171094 A1 * | 7/2010 | Lu et al. | 257/13 |
| 2010/0181586 A1 * | 7/2010 | Kim | 257/98 |
| 2010/0219434 A1 * | 9/2010 | Kim | 257/98 |

FOREIGN PATENT DOCUMENTS

| | | |
|---|---|---|
| KR | 10-0640497 B1 | 11/2006 |
| KR | 10-2007-0087502 A | 8/2007 |
| KR | 10-2008-0048707 A | 6/2008 |
| KR | 10-2008-0058954 A | 6/2008 |
| KR | 10-0843426 B1 | 7/2008 |
| WO | WO 2007/004701 A1 | 1/2007 |
| WO | WO 2009/039212 A1 | 3/2009 |

* cited by examiner

FIG.3
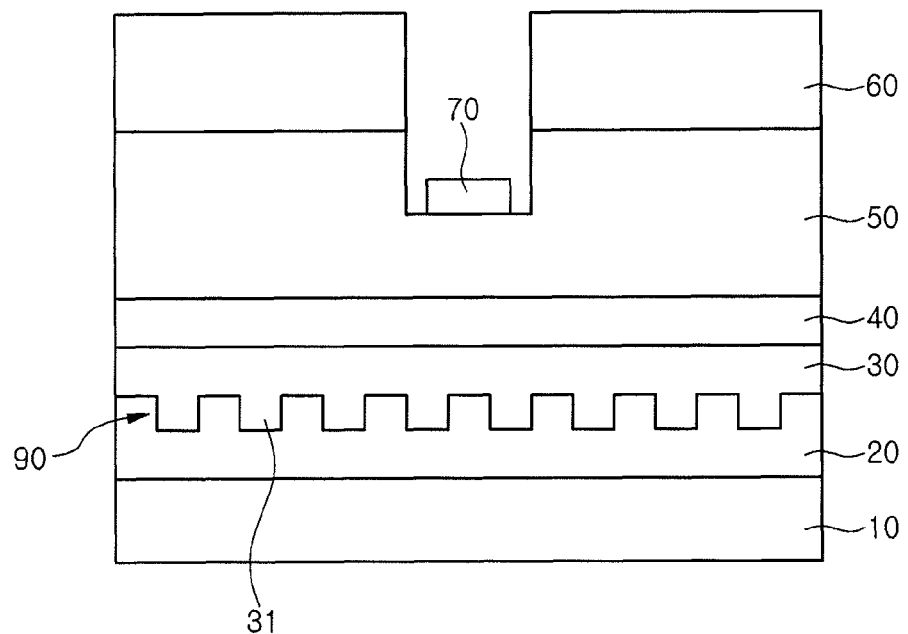
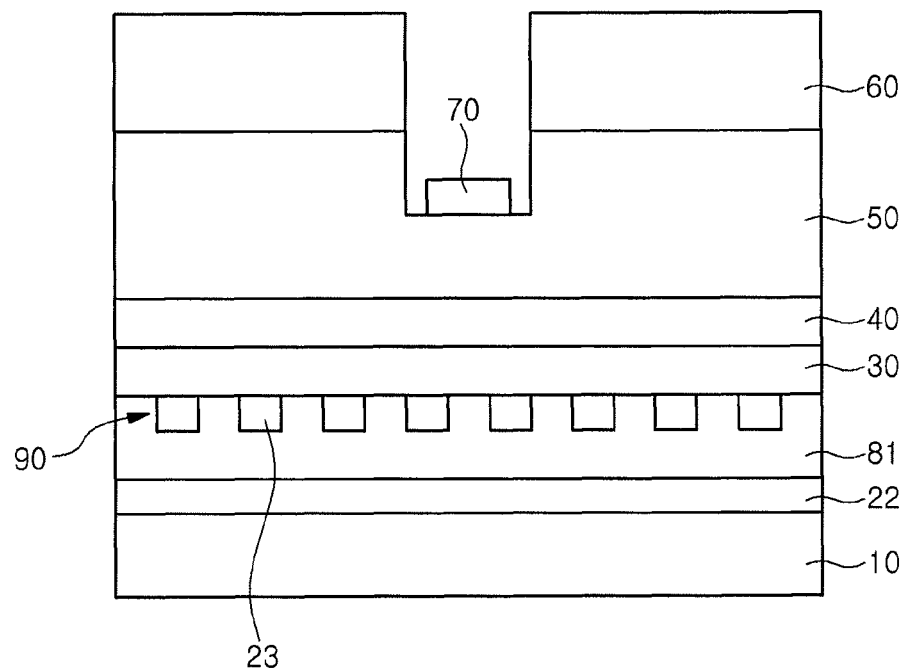
FIG.4

US 8,115,224 B2

LIGHT EMITTING DEVICE

CROSS-REFERENCE TO RELATED APPLICATIONS

The present application claims priority under 35 U.S.C. 119 and 35 U.S.C. 365 to Korean Patent Application No. 10-2009-0004951 (filed on Jan. 21, 2009), which is hereby incorporated by reference in its entirety.

BACKGROUND OF THE INVENTION

1. Field of Invention

The disclosure relates to a light emitting device for converting a current into light.

2. Discussion of the Related Art

A light emitting diode (LED) is a semiconductor light emitting device used to convert a current into light.

The wavelength of light emitted from the LED depends on a semiconductor material used to manufacture the LED. This is because the wavelength of the emitted light depends on a band-gap of the semiconductor material representing an energy difference between electrons of a valence band and electrons of a conduction band.

Recently, the brightness of the conventional LED has increased, so that the conventional LED has been employed as a light source for a display device, a vehicle, or an illumination device. In addition, the conventional LED can represent a white color having superior light efficiency by employing phosphors or combining LEDs having various colors.

Meanwhile, the brightness of the conventional LED is changed according to various conditions such as an active-layer structure, a light extraction structure for extracting light to the outside, a chip size, and the type of molding materials surrounding the LED.

SUMMARY OF THE INVENTION

An embodiment of the invention provides a light emitting device employing an improved structure.

The embodiment provides a light emitting device having improved light extraction efficiency.

According to one embodiment, there is a light emitting device that includes a first photonic crystal structure including a reflective layer and non-metal pattern elements on the reflective layer, a second conductive semiconductor layer on both the reflective layer and the non-metal pattern elements, an active layer on the second conductive semiconductor layer, and a first conductive semiconductor layer on the active layer.

According to another embodiment, there is a light emitting device that includes a reflective layer, a transparent electrode layer including protrusion pattern elements protruding in an arrangement direction of the reflective layer on the reflective layer, a second conductive semiconductor layer on the transparent electrode layer, an active layer on the second conductive semiconductor layer, and a first conductive semiconductor layer on the active layer.

According to another embodiment, there is a light emitting device includes a first photonic crystal structure including a transparent electrode layer and reflective pattern elements on the transparent electrode layer, a second conductive semiconductor layer on both the transparent electrode layer and the reflective pattern elements, an active layer on the second conductive semiconductor layer, and a first conductive semiconductor layer on the active layer.

BRIEF DESCRIPTION OF THE DRAWINGS

FIG. 3 is a view showing a light emitting device according to a third embodiment;

FIG. 4 is a view showing a light emitting device according to a fourth embodiment;

DETAILED DESCRIPTION OF THE EMBODIMENTS

Figure 1:
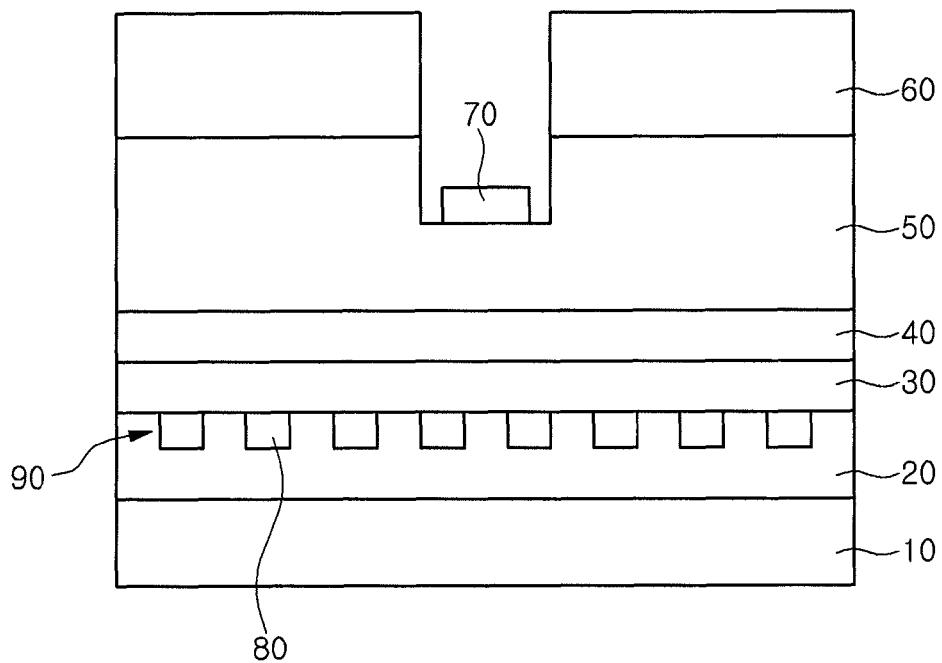
FIG. 1 is a view showing a light emitting device according to a first embodiment.

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Further, "on" or "under" of each layer is determined based on the drawing.

The thickness and size of each layer shown in the drawings can be exaggerated, omitted or schematically drawn for the purpose of convenience or clarity. In addition, the size of elements does not utterly reflect an actual size.

Hereinafter, a light emitting device according to embodiments will be described in detail with respect to accompanying drawings.

FIG. 1 is a view showing a light emitting device according to a first embodiment.

Referring to FIG. 1, the light emitting device according to the first embodiment includes a second electrode layer 10, a reflective layer 20 formed on the second electrode layer 10, a non-metal pattern layer 80 formed on the reflective layer 20, a second conductive semiconductor layer 30 formed on both the non-metal pattern layer 80 and the reflective layer 20, an active layer 40 formed on the second conductive semiconductor layer 30, a first conductive semiconductor layer 50 formed on the active layer 40, and a first electrode layer 70 formed on the first conductive semiconductor layer 50.

A non-conductive semiconductor layer 60 may be selectively formed on the first conductive semiconductor layer 50.

In more detail, the second electrode layer 10 may include at least one of copper (Cu), titanium (Ti), chromium (Cr), nickel (Ni), aluminum (Al), platinum (Pt), gold (Au), tungsten (W), and a semiconductor substrate doped with impurities. The second electrode layer 10 supplies power to the active layer 40 in cooperation with the first electrode layer 70.

The reflective layer 20 may include at least one of silver (Ag), alloy including Ag, Al, and alloy including Al which have a high reflective index.

Although not shown in FIG. 1, an adhesion metal layer including nickel (Ni) or titanium (Ti) may be formed between the second electrode layer 10 and the reflective layer 20 such that an interfacial adhesion strength can be enhanced between the second electrode layer 10 and the reflective layer 20.

The non-metal pattern layer 80 that is formed on the reflective layer 20 faces the second conductive semiconductor layer 30. At least a portion of a side surface of the non-metal pattern layer 80 may be surrounded by the reflective layer 20.

The non-metal pattern layer 80 and the reflective layer 20 form a first photonic crystal structure 90.

The non-metal pattern layer 80 includes a non-metal material, and has a refractive index greater than that of air and smaller than that of the second conductive semiconductor layer 30.

The non-metal pattern layer 80 may be formed by patterning a non-metal layer after forming the non-metal layer on the second conductive semiconductor layer 30 in the manufacturing process of the light emitting device. Thereafter, the reflective layer 20 may be formed on the resultant structure. As shown in FIG. 1, the light emitting device is formed with the second electrode layer 10, the reflective layer 20 is provided on a side surface or a lower surface of the non-metal pattern layer 80. In addition, the second electrode layer 10 is provided on a lower surface of the reflective layer 20.

The non-metal pattern layer 80 may include a transparent electrode, for example, at least one of tin-doped indium oxide (ITO), zinc oxide (ZnO), gallium-doped zinc oxide (GZO), ruthenium oxide ($RuO_x$), and iron oxide ($IrO_x$).

The non-metal pattern layer 80 may include a dielectric substance. For example, the non-metal pattern layer 80 may include at least one of silicon oxide ($SiO_2$), magnesium fluoride ($MgF_2$), titanium dioxide ($TiO_2$), aluminum oxide ($Al_2O_3$), spin on glass (SOG), and silicon nitride ($Si_3N_4$). When the non-metal pattern layer 80 includes a dielectric substance, since a current does not flow through the non-metal pattern layer 80, the non-metal pattern layer 80 has pattern elements spaced apart from each other by a predetermined interval as shown in the sectional view of FIG. 1. In this case, the second conductive semiconductor layer 30 partially faces the reflective layer 20.

The reflective layer 20 may have pattern elements spaced apart from each other by a predetermined interval on the same horizontal plane as that of the non-metal pattern layer 80.

Although not shown, an ohmic-contact layer can be formed between the reflective layer 20 and the second conductive semiconductor layer 30.

Figure 12:
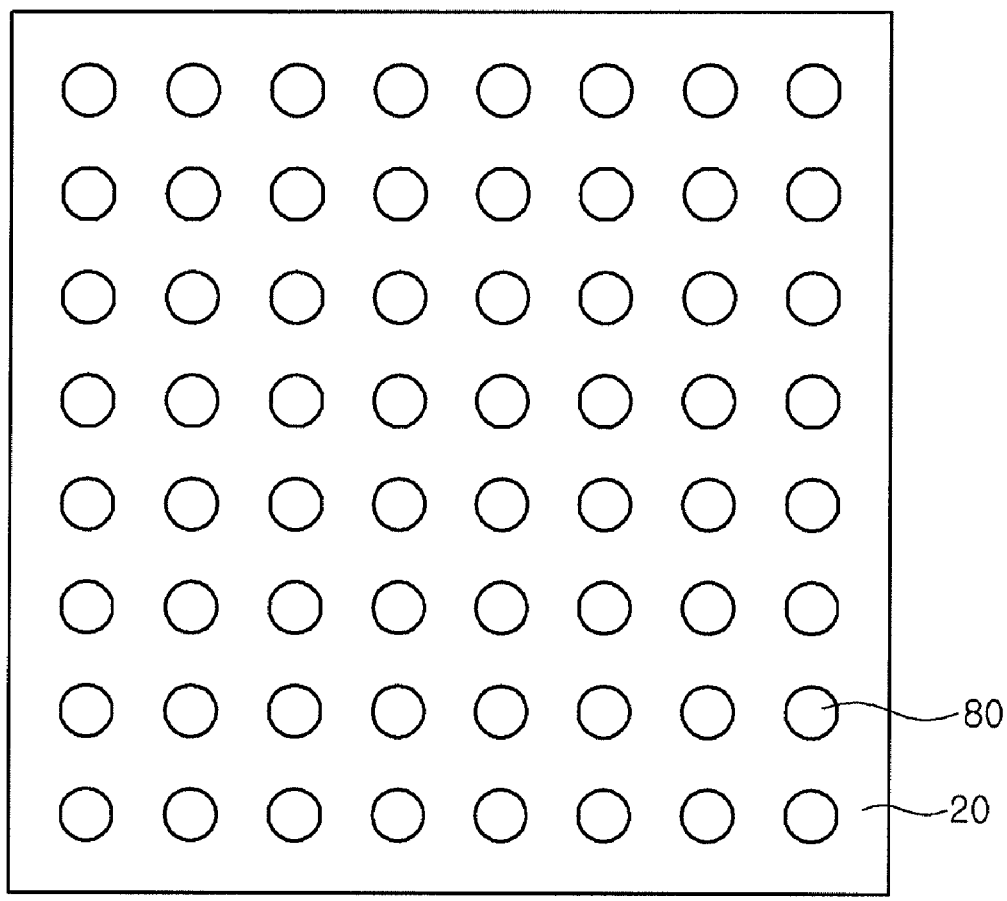
FIGS. 12 and 13 are plan views showing the first photonic crystal structure.
Figure 13:
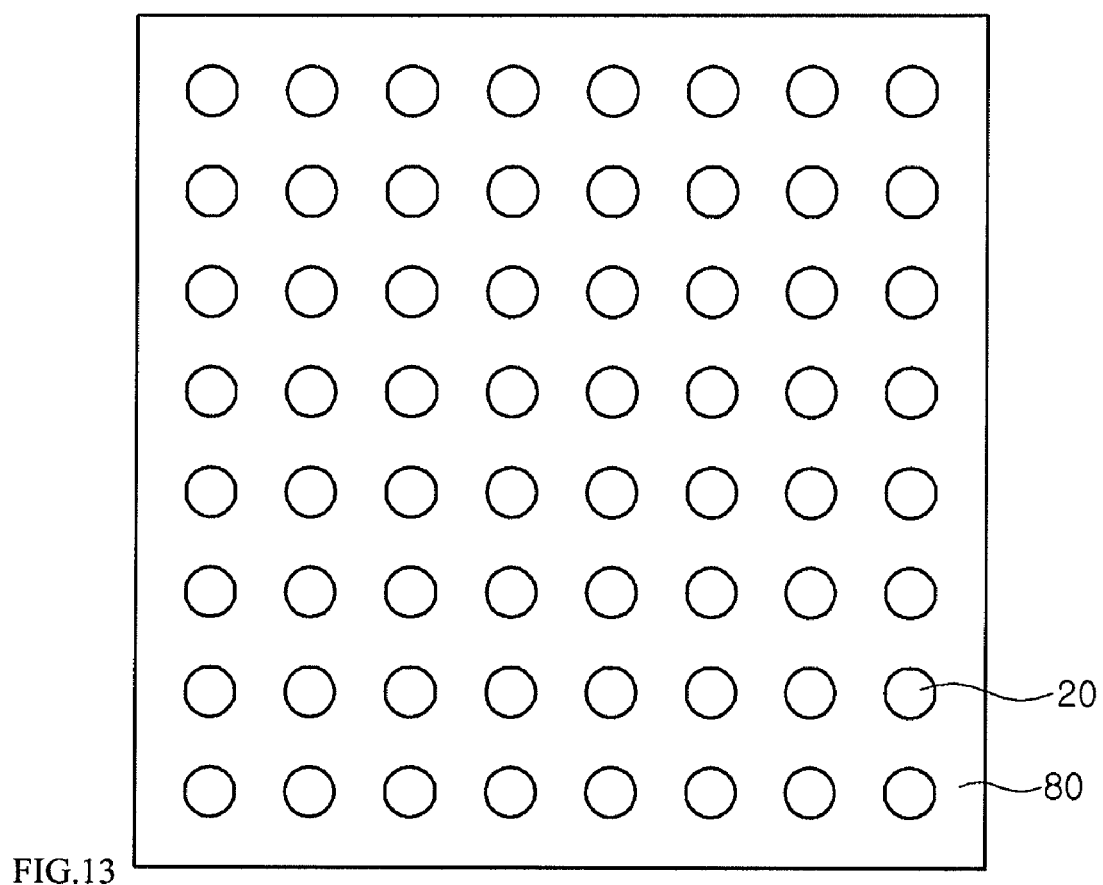

FIGS. 12 and 13 are plan views showing the first photonic crystal structure 90.

As shown in FIG. 12, the non-metal pattern layer 80 may have pattern elements spaced apart from each other on the reflective layer 20. As shown in FIG. 13, the reflective layer 20 may have pattern elements spaced apart from each other on the non-metal pattern layer 80.

The reflective layer 20 and the non-metal pattern layer 80 that form the first photonic crystal structure 90 allow light to be effectively transmitted from the light emitting device.

The light extraction efficiency of the first photonic crystal structure 90 can be determined according to a refractive index contrast. When the non-metal pattern layer 80 is formed of using a transparent electrode or a dielectric substance, and the reflective layer 20 is formed of a metal mirror below or beside the non-metal pattern layer 80, a greater diffraction effect is generated as compared with the diffraction effect caused by the refractive index contrast.

Meanwhile, the second conductive semiconductor layer 30 may be formed as a GaN-based semiconductor layer doped with P-type impurities, and the first conductive semiconductor layer 50 may be formed as a GaN-based semiconductor layer doped with N-type impurities. The active layer 40 may have at least one of a single quantum well structure, a multi-quantum well structure, a quantum-wire structure, and a quantum dot structure.

The non-conductive semiconductor layer 60 may be selectively formed, and has electrical conductivity significantly lower than those of the first conductive semiconductor layer 50 and the second conductive semiconductor layer 30. For example, the non-conductive semiconductor layer 60 may be an un-doped GaN layer.

As described above, according to the light emitting device of the first embodiment, the first electrode layer 70 is aligned perpendicularly to the second electrode layer 10 and the non-metal pattern layer 80, including a transparent electrode or a dielectric substance, is formed between the second conductive semiconductor layer 30 and the reflective layer 20, so that the first photonic crystal structure 90 (including the reflective layer 20 that is in contact with the lower surface and side surfaces of the non-metal pattern layer 80) can be obtained.

The first photonic crystal structure 90 includes the non-metal pattern layer 80 formed of a transparent electrode or a dielectric substance and the reflective layer 20 includes metal having a refractive index represented in a complex number, such that a strong diffraction effect can be represented. Accordingly, the light extraction effect can be improved.

Figure 2:
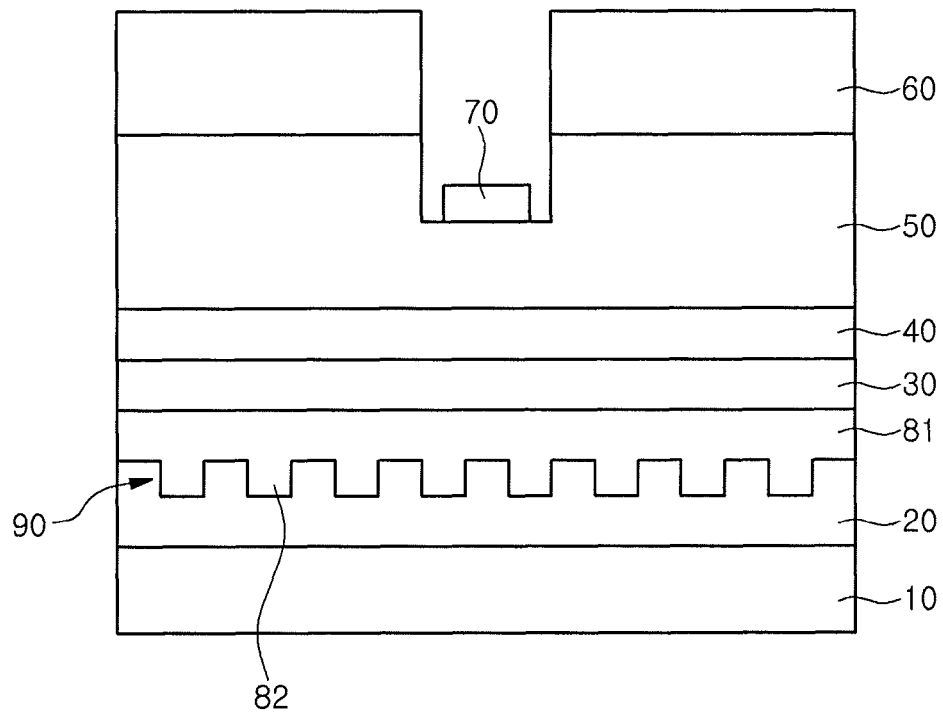
FIG. 2 is a view showing a light emitting device according to a second embodiment.

FIG. 2 is a view showing a light emitting device according to a second embodiment. In the following description, details identical to those of the first embodiment will be omitted in order to avoid redundancy.

Referring to FIG. 2, the light emitting device according to the second embodiment includes the second electrode layer 10, the reflective layer 20 formed on the second electrode layer 10, a transparent electrode layer 81 having a protrusion pattern layer 82 on the reflective layer 20, the second conductive semiconductor layer 30 formed on the transparent electrode layer 81, the active layer 40 formed on the second conductive semiconductor layer 30, the first conductive semiconductor layer 50 formed on the active layer 40, and the first electrode layer 70 formed on the first conductive semiconductor layer 50.

The non-conductive semiconductor layer 60 may be selectively formed on the first conductive semiconductor layer 50.

In the light emitting device according to the second embodiment, the protrusion pattern layer 82 of the transparent electrode layer 81 and the reflective layer 20 form the first photonic crystal structure 90.

The protrusion pattern layer 82 protrudes towards the reflective layer 20. The protrusion pattern layer 82 may have pattern elements spaced apart from each other by a predetermined interval. In other words, lower surfaces and side surfaces of the pattern elements of the protrusion pattern layer 82 are surrounded by the reflective layer 20.

The protrusion pattern layer 82 may be formed by selectively etching or depositing the transparent electrode layer 81 after forming the transparent electrode layer 81 on the second conductive semiconductor layer 30.

The transparent electrode layer 81 may include at least one of ITO, ZnO, GZO, $RuO_x$, and $IrO_x$.

It is not necessary that the pattern elements of the protrusion pattern layer 82 are spaced apart from each other by a predetermined interval. For instance, the transparent electrode layer 81 may have a roughness on a surface facing the reflective layer 20.

The first photonic crystal structure 90 includes the protrusion pattern layer 82 of the transparent electrode layer 81 and the reflective layer 20, which is formed as a metal mirror, in the contact with the protrusion pattern layer 82 so that a desirable diffraction effect can be represented.

Accordingly, the light extraction efficiency of the light emitting device can be improved.

FIG. 3 is a view showing a light emitting device according to a third embodiment. In the following description, details identical to that of the first embodiment will be omitted in order to avoid redundancy.

Referring to FIG. 3, the light emitting device according to the third embodiment includes the second electrode layer 10, the reflective layer 20 formed on the second electrode layer 10, the second conductive semiconductor layer 30 including protrusion pattern layer 31 on the reflective layer 20, the active layer 40 formed on the second conductive semiconductor layer 30, the first conductive semiconductor layer 50 formed on the active layer 40, and the first electrode layer 70 formed on the first conductive semiconductor layer 50.

The non-conductive semiconductor layer 60 may be selectively formed on the first conductive semiconductor layer 50.

In the light emitting device according to the third embodiment, the protrusion pattern layer 31 of the second conductive semiconductor layer 30 and the reflective layer 20 form the first photonic crystal structure 90.

The protrusion pattern layer 31 protrudes toward the reflective layer 20, and may have pattern elements spaced apart from each other by a predetermined interval. Lower surfaces and side surfaces of pattern elements of the protrusion pattern layer 31 are surrounded by the reflective layer 20.

The protrusion pattern layer 31 may be formed by selectively etching the second conductive semiconductor layer 30 after forming the second conductive semiconductor layer 30 or by forming roughness on the surface of the second conductive semiconductor layer 30 through the adjustment of a growth condition of the second conductive semiconductor layer 30. Since the protrusion pattern layer 31 may include a GaN-based semiconductor layer, the protrusion pattern layer 31 may be one kind of a non-metal pattern layer.

In this case, it is not necessary that the pattern elements of the protrusion pattern layer 31 are spaced apart from each other by a predetermined interval. For instance, the second conductive semiconductor layer 30 may have a roughness at a surface facing the reflective layer 20.

The first photonic crystal structure 90 includes the protrusion pattern layer 31 of the second conductive semiconductor layer 30, which is formed by using the GaN-based semiconductor layer, and the reflective layer 20, which is formed as a metal mirror, in contact with the protrusion pattern layer 31, so that a desirable diffraction effect can be represented.

Accordingly, the light extraction efficiency of the light emitting device can be improved.

FIG. 4 is a view showing a light emitting device according to a fourth embodiment. In the following description, details identical to that of the first embodiment will be omitted in order to avoid redundancy.

Referring to FIG. 4, the light emitting device according to the fourth embodiment includes the second electrode layer 10, a reflective layer 22 formed on the second electrode layer 10, the transparent electrode layer 81 formed on the reflective layer 22, a reflective pattern layer 23 formed on the transparent electrode layer 81, the second conductive semiconductor layer 30 formed on both the transparent electrode layer 81 and the reflective pattern layer 23, the active layer 40 formed on the second conductive semiconductor layer 30, the first conductive semiconductor layer 50 formed on the active layer 40, and the first electrode layer 70 formed on the first conductive semiconductor layer 50.

In addition, the non-conductive semiconductor layer 60 may be selectively formed on the first conductive semiconductor layer 50.

In the light emitting device according to the fourth embodiment, the transparent electrode layer 81 and the reflective pattern layer 23 form the first photonic crystal structure 90.

The reflective pattern layer 23 may have pattern elements spaced apart from each other by a predetermined interval. In other words, lower surfaces and side surfaces of the pattern elements of the reflective pattern layer 23 are surrounded by the transparent electrode layer 81.

The reflective pattern layer 23 may be formed by selectively etching or depositing a reflective material layer after forming the reflective material layer on the second conductive semiconductor layer 30.

The transparent electrode layer 81 may include at least one of ITO, ZnO, GZO, $RuO_x$, and $IrO_x$.

The first photonic crystal structure 90 includes the transparent electrode layer 81 and the reflective pattern layer 23, so that a desirable diffraction effect can be represented.

The reflective layer 22 is provided under the transparent electrode layer 81 such that light generated from the active layer 40 can be reflected upward. If the second electrode layer 10 includes a material having high reflectivity, the reflective layer 22 can be omitted.

Accordingly, the light extraction efficiency of the light emitting device can be improved.

Figure 5:
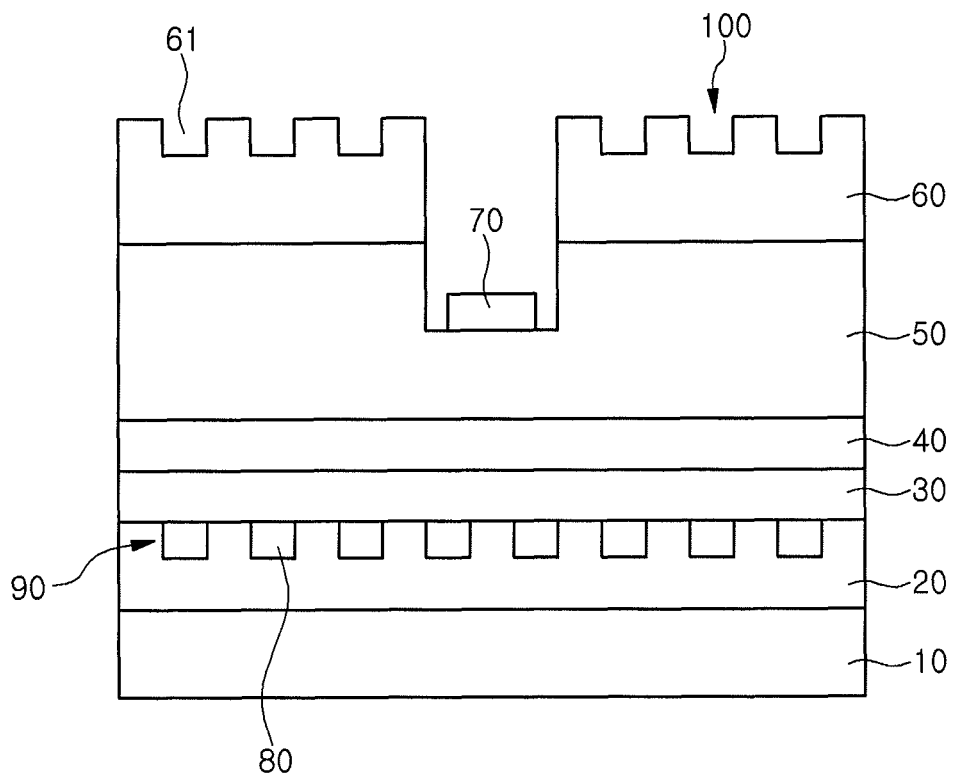
FIG. 5 is a view showing a light emitting device according to a fifth embodiment.

FIG. 5 is a view showing a light emitting device according to a fifth embodiment. In the following description, details identical to that of the first embodiment will be omitted in order to avoid redundancy.

Referring to FIG. 5, the light emitting device according to the fifth embodiment includes the second electrode layer 10, the reflective layer 20 formed on the second electrode layer 10, the non-metal pattern layer 80 formed on the reflective layer 20, the second conductive semiconductor layer 30 formed on both the non-metal pattern layer 80 and the reflective layer 20, the active layer 40 formed on the second conductive semiconductor layer 30, the first conductive semiconductor layer 50 formed on the active layer 40, the first electrode layer 70 formed on the first conductive semiconductor layer 50, and the non-conductive semiconductor layer 60 formed on the first conductive semiconductor layer 50.

A second photonic crystal structure 100 having a column shape or a hole shape is formed from the non-conductive semiconductor layer 60. According to the embodiment, the second photonic crystal structure 100 includes a patterned structure 61. The patterned structure may include holes or columns.

The columns or holes 61 may be aligned with a predetermined interval or randomly. This improves the light extraction efficiency of the light emitting device.

Although the second photonic crystal structure 100 is formed on the non-conductive semiconductor layer 60 according to the fifth embodiment, the second photonic crystal structure 100 is identically applicable to the second to fourth embodiments.

The second photonic crystal structure 100 may be formed on the first conductive semiconductor layer 50 without the non-conductive semiconductor layer 60. This is identically applicable to the second to third embodiments.

Figure 6:
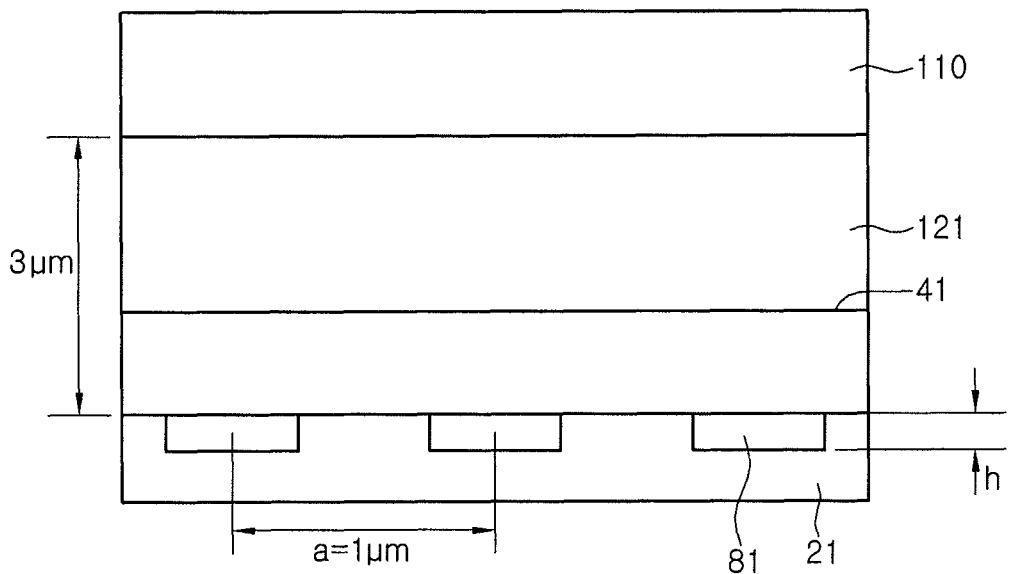
FIG. 6 is a view showing a simulation structure used to determine the effect of a first photonic crystal structure in a light emitting device according to the embodiments.
Figure 7:
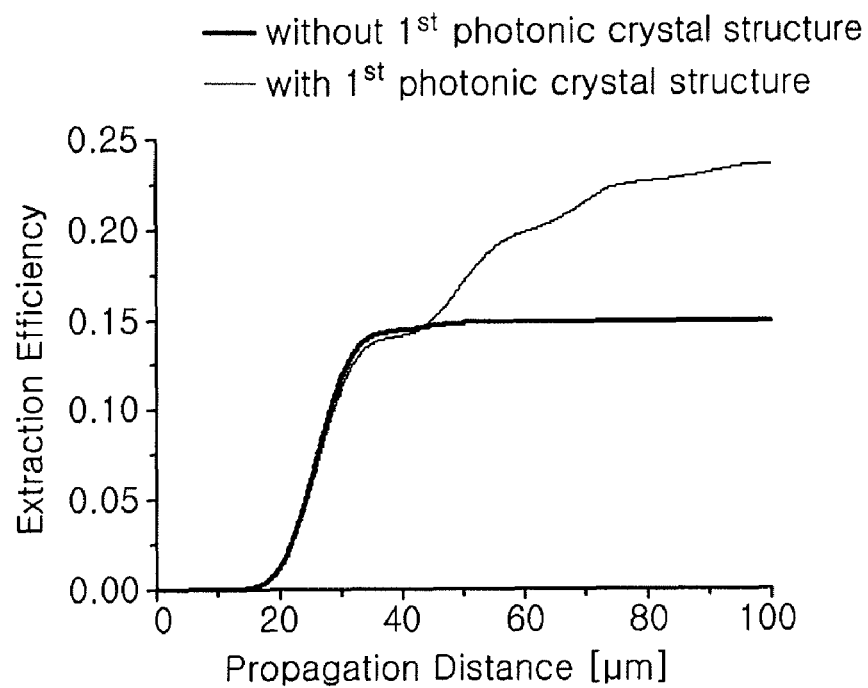
FIG. 7 is a graph showing light extraction efficiency as a function of a propagation distance when the first photonic crystal structure is formed in a light emitting device or not.

FIG. 6 is a view showing a simulation structure used to determine the effect of the first photonic crystal structure 90 in a light emitting device according to the embodiments. FIG. 7 is a graph showing extraction efficiency as a function of a propagation distance when the first photonic crystal structure 90 is formed in a light emitting device or not.

Referring to FIG. 6, a finite different time domain (FDTD) method is utilized to determine the light extraction effect of a first photonic crystal structure. It is assumed that a metal mirror 21 corresponding to the reflective layer includes Ag. A Drude model is employed to precisely depict Ag in a calculation space. ITO is used as a transparent metal for the transparent electrode layer 81. The thickness h of the transparent electrode layer 81 is assumed as 0.1 μm, and a lattice constant of the transparent electrode layer 81 is about 1 μm.

It is assumed that the transparent electrode layer 81 has a refractive index of about 2.0, a light emitting layer on the transparent electrode layer 81 is a GaN layer 121 having a refractive index of about 2.46, and an epoxy layer 110 having a refractive index of about 1.4 is provided on the GaN layer 121. In addition, it is assumed that the GaN layer 121 has a thickness of about 3 μm. A multi quantum well 41 is provided in the GaN layer 121.

Referring to FIG. 7, when comparing a light emitting device employing the first photonic crystal structure with a light emitting device not employing the first photonic crystal structure, the light emitting device having the first photonic crystal structure more increases light extraction efficiency as a propagation distance of light is increased. In contrast, when the light emitting device does not employ the first photonic crystal structure, the light extraction efficiency is not increased after the propagation distance exceeds a predetermined value.

If there is no first photonic crystal structure, it signifies that the non-metal pattern layer 80 or the protrusion pattern layer 31 or 82 is not formed between the second conductive semiconductor layer 30 and the reflective layer 20.

In other words, the light emitting device employing the first photonic crystal structure more increases the light extraction efficiency compared to the light emitting device not employing the first photonic crystal structure.

Figure 8:
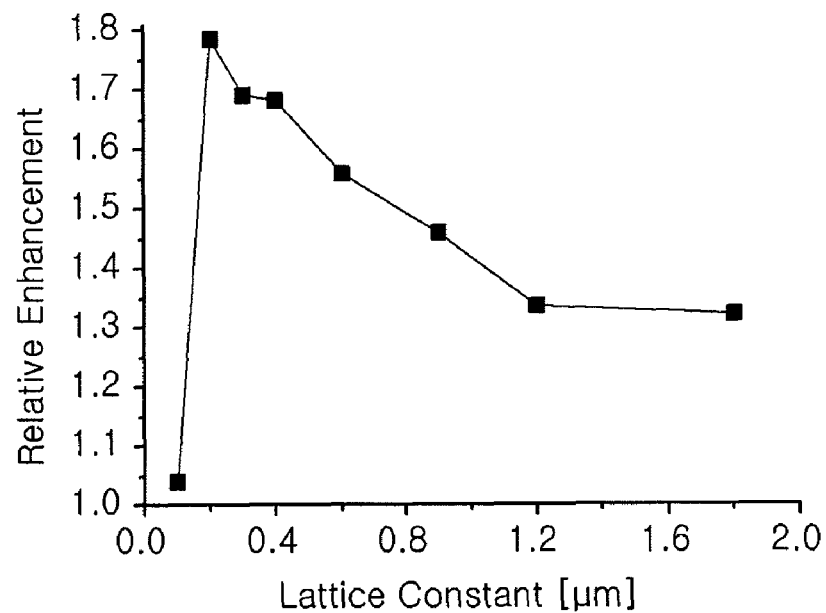
FIG. 8 is a graph representing light extraction efficiency according to a lattice constant of the non-metal pattern elements 80 in the first photonic crystal structure of the light emitting device according to the embodiments.

FIG. 8 is a graph representing light extraction efficiency according to the lattice constant of the non-metal pattern layer 80 in the first photonic crystal structure of the light emitting device according to the embodiments. In particular, FIG. 8 is a graph showing a simulation when the non-metal pattern layer 80 has a refractive index of about 2.0, and includes an ITO layer having a pattern thickness of about 0.1 μm.

Referring to FIG. 8, when the non-metal pattern layer 80 is formed with a lattice constant in the range of about λ/n to about 10λ/n, the light extraction efficiency can be improved. In this case, λ refers to the wavelength of light transmitted from the LED. For example, blue light from the LED has the wavelength of about 470 nm. In addition, n refers to a refractive index of a material forming a light emitting layer of the light emitting device. For example, in the case of a GaN-based semiconductor layer, the refractive index is about 2.46.

Especially, when the non-metal pattern layer 80 is formed with a lattice constant in the range of about λ/n to about 10λ/n, the light extraction efficiency is improved by more than 1.5 times that of the LED not employing the first photonic crystal structure.

According to the embodiment, the light emitting device emits light of about 470 nm and includes a GaN-based semiconductor layer having a refractive index of about 2.46. In this case, λ/n is about 0.191 μm. As shown in FIG. 8, when the non-metal pattern layer 80 has a lattice constant about 0.2 μm, the maximum light extraction efficiency is represented.

Although not shown, in the case of the light emitting device according to the second to fourth embodiments, the light extraction efficiency can be improved when the lattice constant of the protrusion pattern layer 31 or 82 and the reflective pattern layer 23 is in the rang of λ/n to about 10λ/n.

Figure 9:
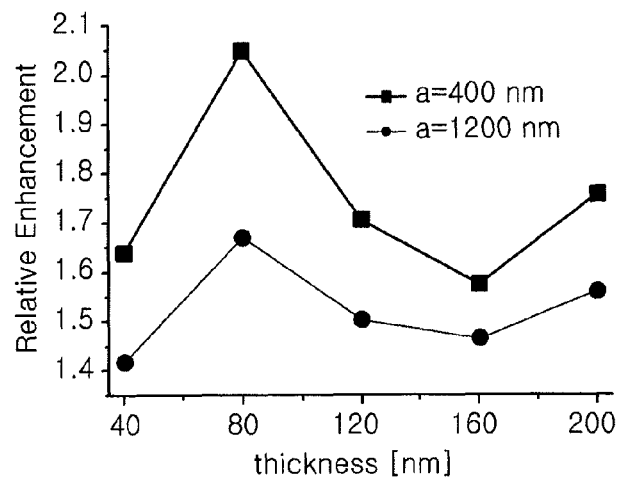
FIG. 9 is a graph representing light extraction efficiency according to the thickness of the non-metal pattern elements 80 in the first photonic crystal structure of the light emitting device according to the embodiments.

FIG. 9 is a graph representing light extraction efficiency according to the pattern thickness of the non-metal pattern layer 80 in the first photonic crystal structure of the light emitting device according to the embodiments. In particular, FIG. 9 is a graph showing a simulation when the non-metal pattern layer 80 has a refractive index of about 2.0, and includes an ITO layer having lattice constants a of about 400 nm and about 1200 nm.

Referring to FIG. 9, when the non-metal pattern layer 80 has a thickness in the range of about 10 nm to 100 nm regardless of the lattice constant of the non-metal pattern layer 80, the light extraction efficiency is improved by more than 1.8 times. When the non-metal pattern layer 80 has a thickness of about 100 nm or more, the light extraction efficiency is more improved compared to that of the light emitting device not employing the first photonic crystal structure. The pattern thickness of the non-metal pattern layer 80 need not exceed about 300 nm or more.

Although not shown, when the protrusion pattern layer 31 or 82 has a lattice constant in the range of about 200 nm to about 700 nm and a thickness in the range of about 200 nm to about 400 nm, the light extraction efficiency of the LED according to the second and third embodiments is improved. When the protrusion pattern layer 31 or 82 has a lattice constant in the range of about 700 nm to about 2000 nm and a thickness in the range of about 600 nm to about 1200 nm, the light extraction efficiency of the light emitting device according to the second and third embodiments is improved.

Figure 10:
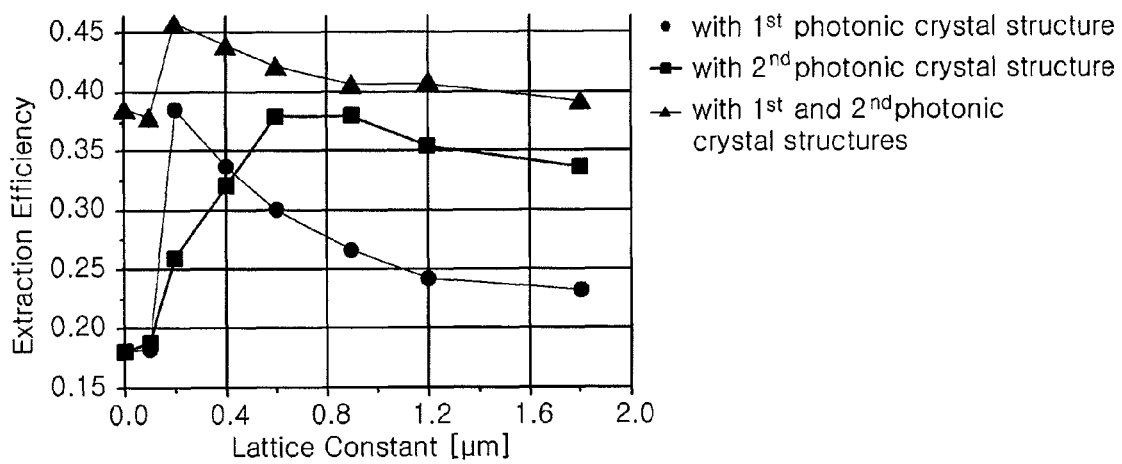
FIG. 10 is a graph showing light extraction efficiency when the first photonic crystal structure, the second photonic crystal structure, and both of the first and second photonic crystal structures are formed in a light emitting device.
Figure 11:
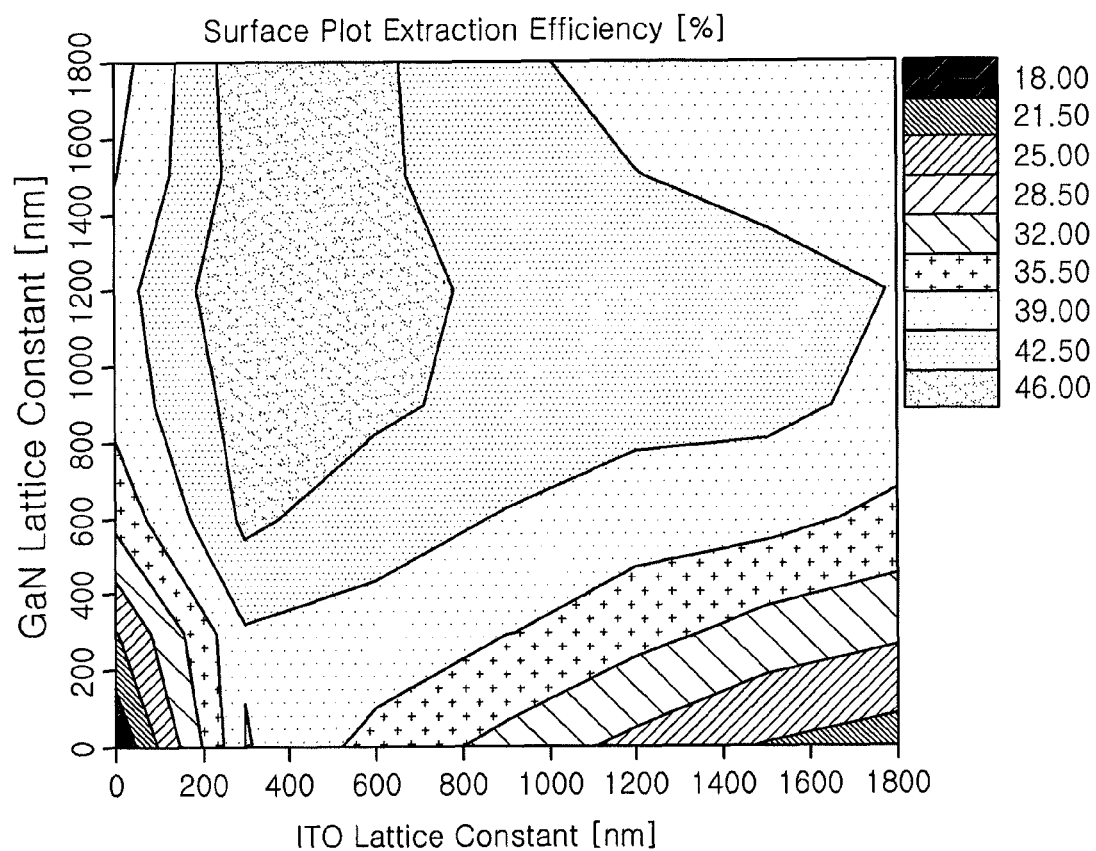
FIG. 11 is a graph showing light extraction efficiency according to the lattice constant of the non-metal pattern elements of the first photonic crystal structure and a lattice constant of columns or holes of the second photonic crystal structure in the light emitting device according to the embodiment.

FIG. 10 is a graph showing light extraction efficiency when the first photonic crystal structure, the second photonic crystal structure, and both the first and second photonic crystal structures are formed in the light emitting device. FIG. 11 is a graph showing light extraction efficiency according to the lattice constant of the non-metal pattern layer of the first photonic crystal structure and a lattice constant of columns or holes of the second photonic crystal structure in the light emitting device according to the embodiment.

Referring to FIGS. 10 and 11, in the case that the first photonic crystal structure is formed, the light extraction efficiency is the maximum when the lattice constant of the non-metal pattern layer 80 forming the first photonic crystal structure is about 0.2 μm. In the case that the second photonic crystal structure is formed, the light extraction efficiency is the maximum when the lattice constant of columns or holes forming the second photonic crystal structure is about 0.6 μm.

In particular, when the first and second photonic crystal structures are formed, the lattice constant of the non-metal pattern layer 80 forming the first photonic crystal structure is in the rang of about 200 nm to about 600 nm, and the lattice constant of columns or holes 61 forming the second photonic crystal structure is in the range of about 600 nm to about 1800 nm, the light extraction efficiency is improved. The patterned structure 61 may be present with any of the previously described embodiments.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A light emitting device, comprising:
    a first photonic crystal structure comprising a reflective layer and a plurality of non-metal pattern elements on the reflective layer;
    a second conductive semiconductor layer on both the reflective layer and the plurality of non-metal pattern elements;
    an active layer on the second conductive semiconductor layer;
    a first conductive semiconductor layer on the active layer;
    a non-conductive semiconductor layer on the first conductive semiconductor layer; and
    a first electrode layer on the first conductive semiconductor layer,
    wherein the non-conductive semiconductor and the first conductive semiconductor layer have a recess in which the first electrode layer is located.

2. The light emitting device of claim 1, further comprising: a second electrode layer under the reflective layer.

3. The light emitting device of claim 1, wherein lower and side surfaces of each of the plurality of non-metal pattern elements are surrounded by the reflective layer.

4. The light emitting device of claim 1, wherein the reflective layer comprises at least one of silver (Ag), alloy comprising Ag, aluminum (Al), and alloy comprising Al.

5. The light emitting device of claim 1, wherein the plurality of non-metal pattern elements comprise a transparent electrode.

6. The light emitting device of claim 1, wherein the plurality of non-metal pattern elements comprise a dielectric substance.

7. The light emitting device of claim 1, wherein the plurality of non-metal pattern elements are surrounded by the reflective layer and are arranged with a lattice constant in a range of $\lambda/n$ to $10\lambda/n$, in which $\lambda$ represents a wavelength of light emitted from the light emitting device, and n represents a refractive index of a material forming a light emitting layer of the light emitting device.

8. The light emitting device of claim 1, wherein the reflective layer is surrounded by the plurality non-metal pattern elements so that the reflective layer is arranged with a lattice constant in a range of about $\lambda/n$ to about $10\lambda/n$, in which $\lambda$ represents a wavelength of light emitted from the light emitting device, and n represents a refractive index of a material forming a light emitting layer of the light emitting device.

9. The light emitting device of claim 1, wherein the plurality of non-metal pattern elements are protrusions protruding from the second conductive semiconductor layer toward the reflective layer.

10. The light emitting device of claim 1, further comprising:
    a second photonic crystal structure on the first conductive semiconductor layer.

11. The light emitting device of claim 1, wherein the first electrode layer is directly on the first conductive semiconductor layer.

12. The light emitting device of claim 5, wherein the transparent electrode comprises at least one of tin-doped indium oxide (ITO), zinc oxide (ZnO), gallium-doped zinc oxide (GZO), ruthenium oxide ($RuO_x$), and iron oxide ($IrO_x$).

13. The light emitting device of claim 6, wherein the dielectric substance comprises at least one of silicon oxide ($SiO_2$), magnesium fluoride ($MgF_2$), titanium dioxide ($TiO_2$), aluminum oxide ($Al_2O_3$), spin on glass (SOG), and silicon nitride ($Si_3N_4$).

14. The light emitting device of claim 10, wherein the second photonic crystal structure comprises:
    a patterned structure on a top surface of the non-conductive semiconductor layer.

* * * * *